(12) United States Patent
Windover

(10) Patent No.: US 7,263,248 B2
(45) Date of Patent: Aug. 28, 2007

(54) OPTICAL VIA TO PASS SIGNALS THROUGH A PRINTED CIRCUIT BOARD

(75) Inventor: Lisa A. Windover, San Francisco, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 139 days.

(21) Appl. No.: 10/365,127

(22) Filed: Feb. 11, 2003

(65) Prior Publication Data

US 2004/0156576 A1     Aug. 12, 2004

(51) Int. Cl.
G02B 6/12     (2006.01)
G02B 6/00     (2006.01)

(52) U.S. Cl. .............. 385/14; 385/31; 385/39; 385/88; 385/89

(58) Field of Classification Search ........... 385/14, 385/31, 39, 88, 89
See application file for complete search history.

(56) References Cited

U.S. PATENT DOCUMENTS

| | | | | |
|---|---|---|---|---|
| 4,732,446 A | * | 3/1988 | Gipson et al. | 385/24 |
| 4,897,711 A | * | 1/1990 | Blonder et al. | 257/48 |
| 6,236,786 B1 | * | 5/2001 | Aoki et al. | 385/50 |
| 6,330,377 B1 | * | 12/2001 | Kosemura | 385/14 |
| 6,477,286 B1 | * | 11/2002 | Ouchi | 385/14 |
| 6,483,960 B2 | * | 11/2002 | Schroedinger | 385/14 |
| 6,512,861 B2 | * | 1/2003 | Chakravorty et al. | 385/14 |
| 6,529,650 B1 | * | 3/2003 | Tsuru | 385/14 |
| 6,754,407 B2 | * | 6/2004 | Chakravorty et al. | 385/14 |
| 6,810,160 B2 | * | 10/2004 | Kato et al. | 385/14 |
| 2002/0051599 A1 | * | 5/2002 | Tsukamoto et al. | 385/14 |
| 2002/0097962 A1 | * | 7/2002 | Yoshimura et al. | 385/50 |
| 2004/0042705 A1 | * | 3/2004 | Uchida et al. | 385/14 |
| 2005/0094922 A1 | * | 5/2005 | Ha et al. | 385/14 |
| 2005/0180681 A1 | * | 8/2005 | Umebayshi et al. | 385/15 |

FOREIGN PATENT DOCUMENTS

| | | |
|---|---|---|
| EP | 0 986 197 | 3/2000 |
| JP | 03103804 A * | 4/1991 |
| WO | WO 02/50592 | 6/2002 |

OTHER PUBLICATIONS

E. Griese, Optical Multimode Interconnects for Printed Circuit Board Application, Cleo 2000, pp. 536-537 (May 2000).

* cited by examiner

Primary Examiner—Sung Pak

(57) ABSTRACT

An optical via within a printed circuit board (PCB) to route optical signals from one level to another through the PCB. The optical signals entering the optical via from an opto-electronic device, or other source, may be routed by an optical waveguide to enter other optical vias to a destination for different purposes. The source of optical signals may be mounted to the PCB or it may be at a distance, with the optical signals being coupled to or away from the optical via by means of optical waveguides.

2 Claims, 3 Drawing Sheets

OPTICAL VIA TO PASS SIGNALS THROUGH A PRINTED CIRCUIT BOARD

BACKGROUND

1. Field of the Invention

The present invention relates generally to optical communications through layers of printed circuit board (PCBs).

2. Discussion of the Related Art

Multi-layer PCBs are required due to the large number of electrical signals and the necessarily large number of signal paths. Limitations exist with this prior art technology with regard to how closely spaced electrical signal paths can be placed. Spacing limitations are a result of increasing signal speeds, potential metal migration problems (growth and shorting as a result of voltage differentials), and manufacturing specifications. Also, the length of a circuit from one device to another becomes a concern as circuit input/output speeds increase. Thus, device connection lengths become important concerns with limitations that are, at times, very difficult to overcome. The prior art also utilizes plating and etching processes which can be prone to manufacturing defects such as over-etching a circuit (potential open circuit or future open circuit) or under-etching, which has the potential to have a short circuit from one circuit to another (or future short). Systems which use electrical signals to transmit information from one chip to another on the same printed circuit board, or to another printed circuit board (PCB) with an electrical backplane, typically use multi-layer printed circuit boards in order to route the numerous signals on the PCB.

Present day multi-layer PCBs are manufactured with both surface and multiple internal layers of circuit carriers, commonly referred to as inner-planes. Via holes, usually copper, are used to carry signals from one location to another through the surface and inner-plane circuit connections. Via holes are also used to connect surface mount devices to inner-planes. Circuit pads on the surface layers are used for surface mounted devices (SMDs) and larger via holes are used to connect devices with through-pins from the device to another signal layer in the same PCB. Internal via connections are also used to internally connect a signal from one inner-plane to another inner-plane.

Making via holes with an electrically conductive lining is not suitable when optical signals are introduced to the surface of a multi-layer PCB that needs to be coupled through the PCB to another location, for example, to an internal optical waveguide.

SUMMARY OF THE INVENTION

The present invention provides improvements over the prior art by utilizing optical waveguides in the form of an optical via to transmit signals through PCB layers rather than employing standard copper (or other metal) signal carriers. Various embodiments of the invention utilize optical carriers to route optical signals and to interconnect input/output devices within a PCB and alternatively route optical signals from one chip or integrated circuit (IC) to another in a multi-layer optical waveguide. Some embodiments of the invention employ optical vias to route optical signals through an otherwise electrical PCB to a multi-layer optical waveguide circuit.

Although the embodiments of the invention are described with the use of optical signals, the concepts can include other energy forms such as microwave, for example.

BRIEF DESCRIPTION OF THE DRAWING

The objects, features and advantages of the invention will be more clearly perceived from the following detailed description, when read in conjunction with the accompanying drawing, in which.

DETAILED DESCRIPTION OF THE PREFERRED EMBODIMENTS

Figure 1:
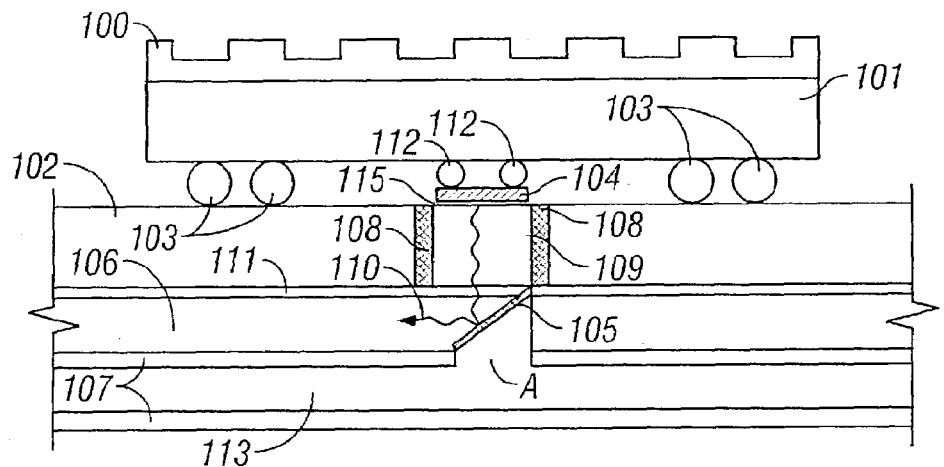
FIG. 1 is an enlarged cross-sectional view showing an integrated circuit/optoelectronic device with an optical via and an optical waveguide layer in accordance with an embodiment of the invention.

Before explaining the disclosed embodiments of the present invention in detail, it is to be understood that the invention is not limited in its application to the details of the particular arrangements shown, since the invention is capable of other embodiments. Also, the terminology used herein is for the purpose of description and not of limitation.

Generally the invention employs optical vias to pass optical signals through a PCB, such as from an optoelectronic device, such as a VCSEL, to another location for any desired purpose. For example, an embodiment of the invention utilizes optoelectronic devices (OEDs) mounted to, or remote from, integrated circuits to send and receive optical signals. A PCB can be configured for surface mounting of integrated circuits providing voltage and mechanical connection pads along with optical via-hole connections.

In some embodiments, the present invention utilizes optical waveguides or carriers to route optical signals from one location to another. According to one embodiment, once an optical signal has been generated, such as by an OED, the optical signal is routed from the top surface of and through the PCB to an attached optical waveguide carrier. The connection from the top surface to the optical waveguide is through an optical via. The optical via (OV) is a hole in the PCB that is filled with an optical waveguide to route the light signal (emitted or received) through the PCB. The attached waveguide then optically routes the signal to other appropriate locations. The optical signal can be routed to an optoelectronic device, such as a photodetector, at a predetermined location on the PCB, or elsewhere if desired, through another OV. Any OED employed could be flip chipped to an IC which could be configured with a conventional heat sink.

An OED can be a vertical-cavity surface-emitting laser (VCSEL) or a photodetector that could be mounted in a "flip-chip" style onto an IC device such that optical signals are emitted perpendicular to the IC and thus perpendicular to the PCB. In such an arrangement, the IC/OED is mounted onto the PCB (onto an electrical pad layout) at a predetermined position relative to the IC electrical pads. The IC still has surface mounting pads for voltage, and ground, for example. The relationship between the IC pads and the OED(s) could well be specified for manufacturing mounting requirements. Thus, in this case, the VCSEL would be a bottom-emitting device, and a detector at a different location would be a bottom-receiving or bottom-illuminated device. The IC/OED would be mounted in position over the OV. Optoelectronic devices in combination with the appropriate ICs which both emit and receive optical signals (transceivers) are also within the scope of this invention.

An optical waveguide can be formed, as an example, within the hole of the PCB by first coating the walls of the OV hole with a material of one index of refraction (for example, a polymer). This first coating becomes the cladding of the OV waveguide. The remainder of the OV is then filled with a material with a slightly different (higher) index of refraction to form the optical waveguide core in the OV. This structure provides that light beams or signals are guided through the core of the OV in an efficient, effective and positive manner. Other ways to form the desired optical characteristics in the OV may be employed. It is possible that a core and cladding unit could be preformed and inserted into the appropriate hole in the PCB.

A refractive index matching fluid should be used between the bottom of the PCB and the top of the attached waveguide. A thin layer of such material would be sandwiched between the transmission portion of the optical waveguide and the bottom of the PCB in order to maintain guiding of light from the OV to the optical waveguide. Finally, the outer layer of the optical waveguide layer would typically consist of a cladding material.

An embodiment of the present invention contemplates an optical waveguide (optical via) completely through a PCB so that an optical signal from any source external to the PCB can be transmitted through the PCB to be received or further transmitted by any suitable means on or from the opposite side of the PCB.

Another embodiment of the invention incorporates an OV partially through the PCB from one surface to an internal optical waveguide which is typically arranged parallel to the PCB surface. That waveguide can be employed to transmit the optical signal from one OV to another OV, or to a location at the edge of the PCB for coupling to another device or to another PCB or backplane.

A multi-layer optical waveguide can be used where the quantity of optical circuits are such as to need an increase in density. By using multi-layer waveguides, optical signals can be split into "x" and "y" plane channels.

Advanced levels of VCSEL controls allow for polarization controls such that a dielectric stack can pass one polarization in one direction along a waveguide and pass another polarization along another direction. Also, tunable VCSEL controls that can change the optical signal wavelength (under control) can accomplish sending an optical signal in one direction versus another direction along a waveguide by using a dielectric stack that passes one wavelength and reflects another.

With reference now to the drawing, FIG. 1 is a cross-sectional depiction of IC 101 mounted to PCB 102, showing optical via (OV) 109 and optical waveguide layer 106. IC 101 is mounted flip-chip style with heat sink 100 for cooling mounted on its upper surface. Conventional IC mounting pads 103 can be used in mounting IC 101 to PCB 102. An optical signal source or optoelectronic device (OED) 104, for example (only one is shown), is mounted to the IC using mounting pads 112. One example of a suitable optical signal source 104 is a VCSEL. There could be many others and the term "VCSEL" will be used herein for simplicity. A VCSEL-to-OV gap 115 is designed into the tolerances so as to protect the VCSEL from possible damage during the assembly process. The VCSEL is configured to emit optical signal 110 into OV 109.

An optical waveguide is formed within the OV hole of PCB 102 by appropriate means, such as by first coating the wall of OV 109 with a material 108 of one index of refraction (for example, a polymer). This first coating becomes the cladding of the OV waveguide. The remainder of OV 109 is then filled with an optical waveguide material, such as glass, with a slightly higher index of refraction than the cladding to form a core in order to ensure that light is guided through the core of OV 109. Optionally, a segment of an optical waveguide, already having appropriate cladding, may be installed in the hole in the PCB, rather than it being formed in place. Refractive index matching gel 111 is preferably sandwiched between PCB 102 and optical waveguide 106 in order to maintain proper transmission of optical signal 110.

A 90-degree light reflection is achieved by preparing in or on the end of the waveguide a surface 105 at about a 45-degree angle to allow optical signal 110 to be redirected along waveguide 106. Angled reflective surface 105 may be prepared, for example, by cutting with laser ablation. A dielectric stack, beam splitter or micro-mirror, among others, may also be used to direct the optical signal. Waveguide cladding material 107 is shown used on the outside of waveguide 106. An air-gap A is shown at the opposite side of reflecting surface 105. Also shown is second waveguide 113 having cladding 107 on both sides. A second waveguide may or may not be included in the structure, depending on circuit densities required.

Note that although FIG. 1 shows a VCSEL, an optical signal receiving device such as a photodetector could be mounted in much the same manner to IC 101. The photodetector would detect a light signal entering OV 109 from waveguide layer 106 that is directed 90-degrees from the waveguide into the OV. Thus, optical signal 110 would have a direction opposite from that shown in FIG. 1. Waveguide 106 may be positioned on PCB 102 by the use of conventional aligning registration elements, or locating marks (not shown), both in waveguide 106 and in PCB 102.

Figure 2:
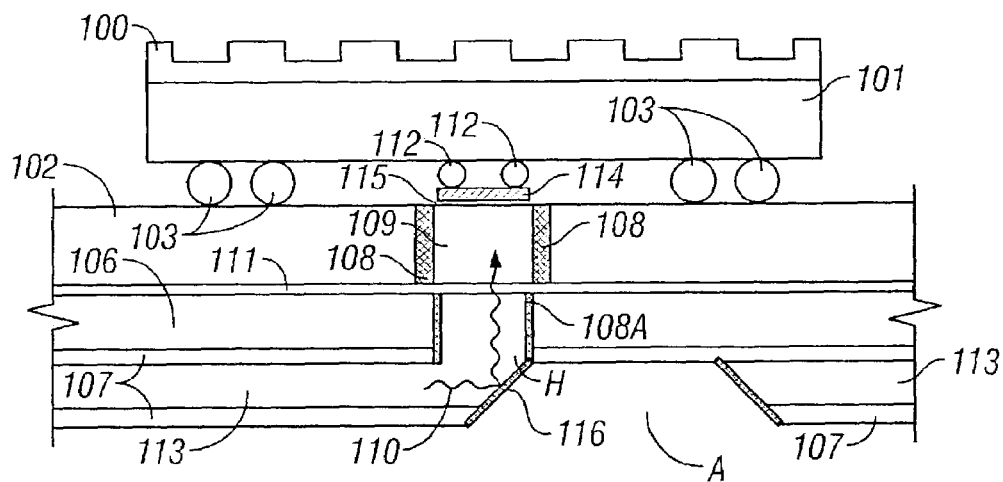
FIG. 2 is a cross-sectional view, similar to FIG. 1, showing a two-layer optical waveguide, in accordance with an embodiment of the invention.

FIG. 2 is a cross-sectional view, similar to FIG. 1, where a two-layer optical waveguide is depicted and the VCSEL is replaced with photodetector 114. First internal waveguide 106 and cladding 107 are shown along with a second waveguide 113 and outer cladding 107. Photodetector 114 acts to detect optical signal 110, which would be an input into IC 101. Precut waveguides 106 and 113 and their respective claddings 107 could be manufactured separately and assembled to each other and to the PCB, and alignment could be accomplished by use of appropriate registration elements (not shown). The input optical signal 110 is deflected by surface 116, which is at about a 45-degree angle, through waveguide hole H cut through the cladding and inner waveguide 106 and up to OV 109. Waveguide hole H is first coated by cladding material 108a, which is similar to material 108, and then filled with an optically transmissive epoxy or gel having a refractive index substantially matching that of OV 109. Waveguide 113 and outer cladding 107 could be continued at a further 45-degree cut point as long as a sufficient air-gap A separates 45-degree surface 116 below OV 109.

Figure 3:
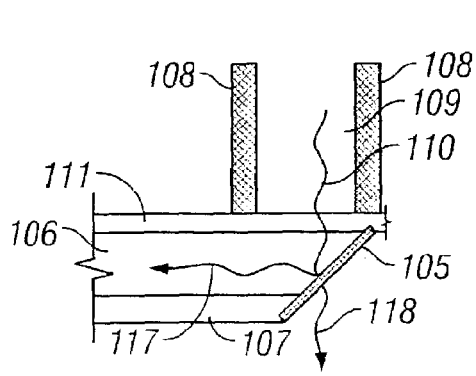
FIG. 3 is a further enlarged cross-sectional view of an optical via, also depicting a dielectric stack or beam splitter, in accordance with an embodiment of the invention.

FIG. 3 is an enlarged cross-sectional view depicting surface 105 at about 45-degrees functioning as a beam splitter which is sometimes referred to as a dielectric stack. Optical signal 110 passes through OV 109 and is then split by dielectric stack 105, which is located in waveguide 106. The optical signal is split into 90-degree offset optical signal 117 which passes along waveguide 106, and optical signal 118 that passes through dielectric stack 105. Optical signal 118 is then available for use, detection, or redirection, possibly by another waveguide or redirecting element (not shown). This technique could be used to allow an optical signal 110 to be sent to more than one photodetector location, for example.

Figure 4:
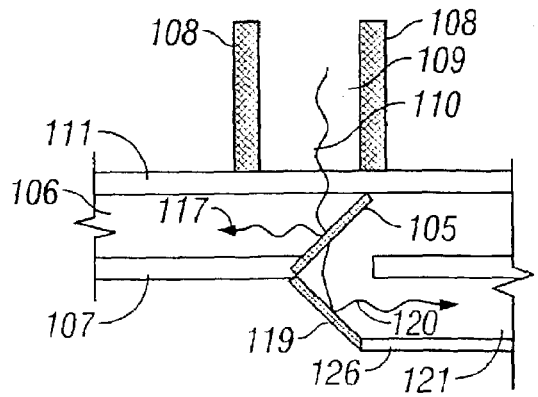
FIG. 4 is another further enlarged cross-sectional view of an optical via depicting two dielectric stacks or beam splitters, in accordance with an embodiment of the invention.

FIG. 4 is again an enlarged cross-sectional view of an OV depicting 45 degree surfaces 105 and 119, with upper surface 105 functioning as a dielectric stack or beam splitter. Upper dielectric stack surface 105 both passes through a portion of optical signal 110 and reflects the remainder of the optical signal 90-degrees to send optical signal 117 along waveguide 106. Second 45-degree surface 119 reflects the pass-through optical signal in a diametrically opposite 90-degree direction to send resultant signal 120 along another waveguide 121 which has cladding 126. In this manner, original optical signal 110 is split into two optical signals 117, 120 for transmission in opposite directions for two separate purposes, such as to terminate at different respective photodetectors.

Figure 5:
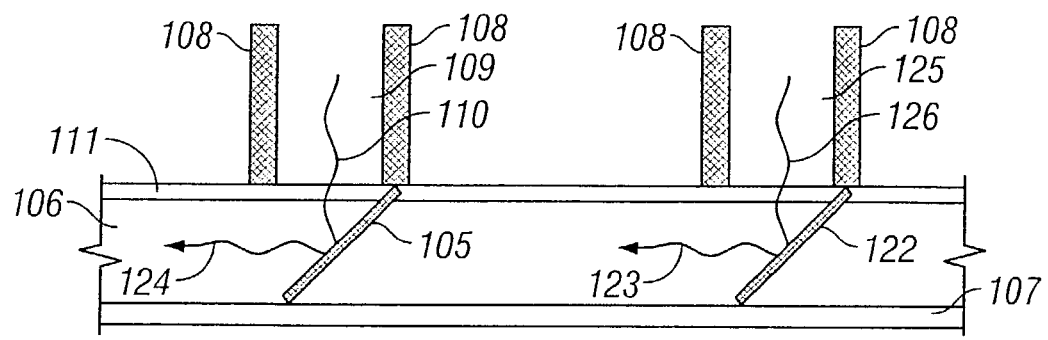
FIG. 5 is still another further enlarged cross-sectional view of two optical vias and two optical signals refracted into one waveguide, in accordance with an embodiment of the invention.

FIG. 5 is another enlarged cross-sectional view showing two optical signals 110 and 126 reflected into one waveguide 106. Optical signal 126 may be originated by a VCSEL (not shown) and directed into OV 125. Another optical signal 110 passes through OV 109. First 45-degree surface 122 reflects optical signal 126 by 90-degrees to become resultant reflected optical signal 123 which passes into waveguide 106. Second 45-degree surface 105 incorporates a dielectric to reflect optical signal 110 into waveguide 106 and pass through optical signal 123. The resulting optical signal 124 is either optical signal 110 "OR" optical signal 123 or "Both". FIG. 5 thus depicts signals which perform a logical "OR" function. This could be accomplished if optical signals 110 and 126 have different wavelengths, for example.

Figure 6:
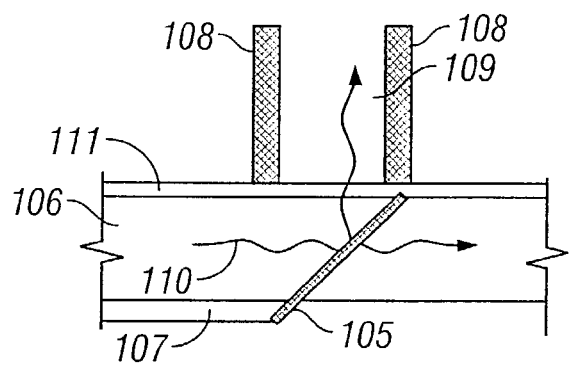
FIG. 6 is yet another further enlarged cross sectional view of an optical signal deflected into an optical via and passed through a dielectric stack to continue along the waveguide, in accordance with an embodiment of the invention.

FIG. 6 is yet another enlarged cross-sectional view of an embodiment of the invention, where optical signal 110 is partially deflected into OV 109 and partially passed through angled surface 105 to continue along waveguide 106. Dielectric stack (beam splitter) 105 acts to split optical signal 110 into OV 109 and also passes a portion of the optical signal through to allow it to continue along waveguide 106.

Figure 7:
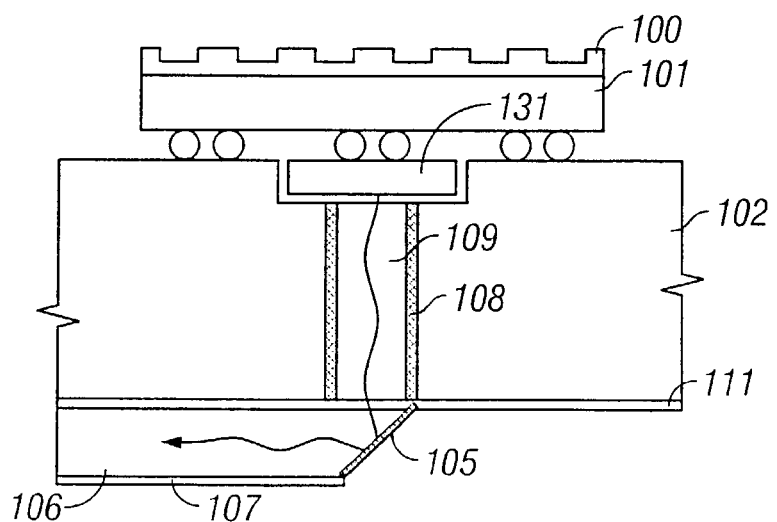
FIG. 7 is a partial cross-sectional view, similar to FIG. 1, of an embodiment of the invention.

FIG. 7 shows a low profile configuration where the OED 131 is mounted to IC 101 which, in turn, has a heat sink upper surface 100. PCB 102 has OV 109 with cladding 108, waveguide 106, reflective angled surface 105, and refractive index matching gel 111. Other elements which may be included and are shown in previously-discussed figures, are omitted here for clarity. The only difference from FIG. 1 is that the PCB and the OV are countersunk so that the IC rests on mounting pads 103 on the top surface of the PCB, and OED 131 resides below the surface of the PCB.

Figure 8:
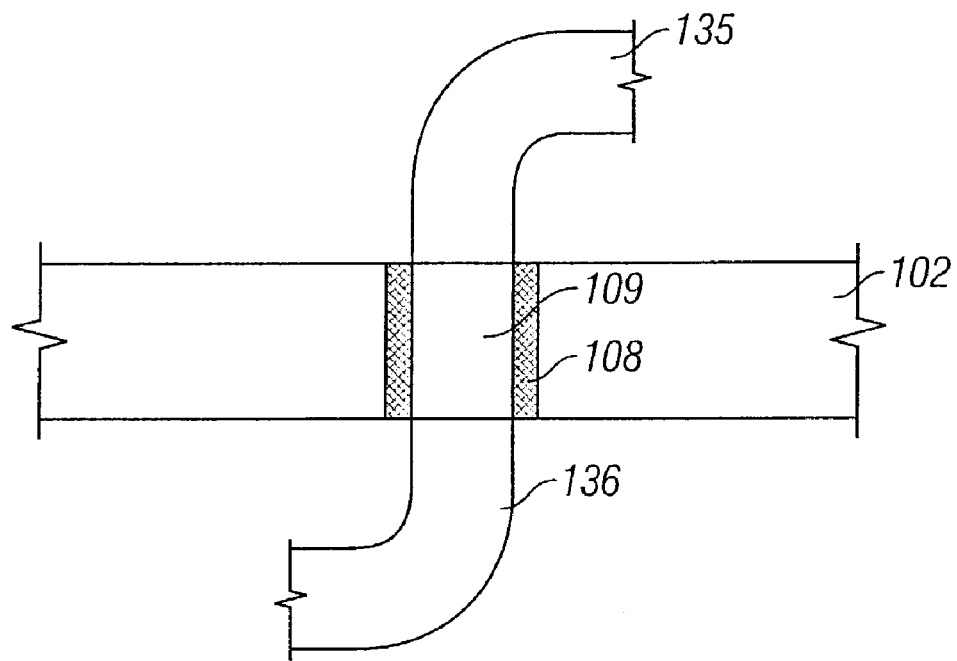
FIG. 8 is another partial cross-sectional view of yet another embodiment of the invention.

FIG. 8 depicts an alternative embodiment where optical fiber or waveguide 135 is coupled directly from an external signal source to OV 109. That signal could be reflected internally as in FIG. 1, or it could pass to another optical waveguide or fiber 136 on the other side of PCB 102.

Figure 9:
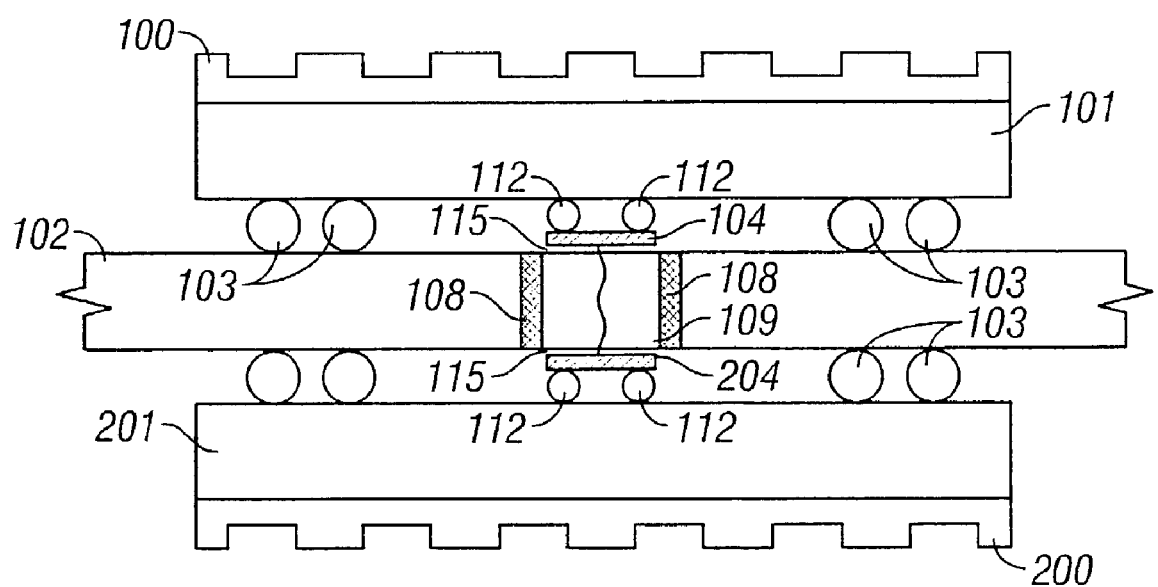
FIG. 9 is a sectional view similar to FIG. 1, showing an optoelectronic device on either end of the optical via.

FIG. 9 shows another alternative embodiment of the invention, where optoelectronic devices 104 and 204 communicate directly through optical via 109. Integrated circuit 201 typically has heat sink 200 thereon, as previously described with respect to FIG. 1. The remaining reference numerals correspond to those in FIG. 1. In this embodiment one of OEDs 104, 204 may be a VCSEL and the other could be a photodetector. Other appropriate elements could also be used.

Although a 45-degree angle has been depicted in the embodiments shown in the figures, different angles may be employed in alternative embodiments, depending on specific requirements. An IC/OED source of an optical signal is shown and described as being mounted directly on the outer surface of a multi-layer PCB. That device could be an optical signal source such as a VCSEL, an optical signal receiving device such as a photodector, or any other source or receiver of an optical signal. Further, the optical signal device could be an optoelectronic transceiver, since elements 104, 204, 114, and 131 can function to emit or receive an optical signal. It is to be understood that any IC/OED that generates or receives an optical signal need not be mounted to the PCB. The optical signal may be coupled to the optical via directly by means of an optical waveguide, or through free space between the OED and the optical via, or by means of a combination thereof. It is contemplated that the various embodiments of the invention transmit, reflect, refract, and partially transmit, reflect or refract, optical signals from whatever source, on or remote from the PCB.

Although the present invention has been described with reference to preferred embodiments, numerous modifications and variations can be made and still the result will come within the scope of the invention. No limitation with respect to the specific embodiments disclosed herein is intended or should be inferred. The invention is defined by the appended claims and their equivalents.

What is claimed is:

1. A printed circuit board (PCB) comprising:
   a mounting surface;
   an optoelectronic device for providing an optical signal, said mounting surface being formed with a cavity and said optoelectronic device residing within said cavity;
   optical waveguide means coupled to said PCB spaced from and substantially parallel with said mounting surface;
   via hole means through said PCB and functioning as an optical waveguide to transmit optical signals therethrough from said optoelectronic device to said optical waveguide means;
   wherein said waveguide means further comprises means to at least partially redirect the optical signal from said via hole along said waveguide means; and
   an integrated circuit (IC), wherein said optoelectronic device is mounted directly onto one side of said IC, with said one side of said IC mounted onto said mounting surface and positioned so that said optoelectronic device is located directly over said via hole.

2. The PCB of claim 1, wherein said IC has a heat sink on a side opposite to said optoelectronic device.

* * * * *